(12) United States Patent
Graham et al.

(10) Patent No.: US 11,352,998 B2
(45) Date of Patent: Jun. 7, 2022

(54) FLEXIBLE INTELLIGENT ELECTRICAL SWITCHING DEVICE WITH MULTI-FUNCTION CAPABILITY

(71) Applicant: Egis Group LLC, Bellingham, WA (US)

(72) Inventors: Eric Graham, Bellingham, WA (US); James Riley, Lakewood, WA (US); Chad Beauregard, Orofino, ID (US); Justin Kaufman, Bellingham, WA (US)

(73) Assignee: Egis Group LLC, Bellingham, WA (US)

( * ) Notice: Subject to any disclaimer, the term of this patent is extended or adjusted under 35 U.S.C. 154(b) by 0 days.

(21) Appl. No.: 16/689,365

(22) Filed: Nov. 20, 2019

(65) Prior Publication Data

US 2020/0158069 A1 May 21, 2020

Related U.S. Application Data

(60) Provisional application No. 62/917,117, filed on Nov. 21, 2018.

(51) Int. Cl.
*H02P 11/00* (2006.01)
*H02H 7/06* (2006.01)
*H02P 9/00* (2006.01)
*F02N 11/08* (2006.01)
*H05K 1/02* (2006.01)
*H05K 1/11* (2006.01)

(52) U.S. Cl.
CPC ........ *F02N 11/0829* (2013.01); *F02N 11/087* (2013.01); *F02N 11/0837* (2013.01); *H02P 9/00* (2013.01); *H02P 11/00* (2013.01); *H05K 1/029* (2013.01); *H05K 1/117* (2013.01); *F02N 11/0866* (2013.01); *F02N 2011/0874* (2013.01); *H02P 2201/01* (2013.01); *H05K 2201/10053* (2013.01); *H05K 2201/10409* (2013.01)

(58) Field of Classification Search
CPC ............. F02N 11/0829; F02N 11/0837; F02N 11/087; H05K 1/029; H05K 1/117
USPC ......................................................... 322/28
See application file for complete search history.

(56) References Cited

U.S. PATENT DOCUMENTS

| | | | |
|---|---|---|---|
| 2003/0116408 A1* | 6/2003 | Topmiller | B65G 47/261 198/781.05 |
| 2015/0159905 A1* | 6/2015 | Lau | F24F 11/81 62/89 |
| 2017/0186577 A1* | 6/2017 | Haines | H05K 5/03 |
| 2019/0002638 A1* | 1/2019 | Zhang | C08J 5/005 |

* cited by examiner

*Primary Examiner* — Andargie M Aychillhum
(74) *Attorney, Agent, or Firm* — White-Welker & Welker, LLC; Matthew T. Welker, Esq.

(57) ABSTRACT

A flexible intelligent electrical switching device with multi-function capability, and methods of use are presented herein which provide an autonomous, reconfigurable switching device. The present disclosure is specifically designed to reduce space, cost of manufacture, efficiency, installation reduction time and ease of implementation.

19 Claims, 13 Drawing Sheets

FLEXIBLE INTELLIGENT ELECTRICAL SWITCHING DEVICE WITH MULTI-FUNCTION CAPABILITY

CROSS-REFERENCE TO RELATED APPLICATIONS

The present application claims priority to U.S. Provisional Patent Application No. 62/917,117 which was filed on Nov. 21, 2018, which is hereby incorporated by reference herein in its entirety, including any figures, tables, or drawings.

FIELD OF THE DISCLOSURE

The present disclosure relates generally to an intelligent switching device. More specifically, the present disclosure is a flexible intelligent electrical switching device with multi-function capability, and methods of use which provides an autonomous, reconfigurable switching device. The present disclosure is specifically designed to reduce space, cost of manufacture, efficiency, installation reduction time and ease of implementation. However, the present disclosure is not limited to these novel and inventive improvements, and it may further be adapted for a variety of purposes.

COPYRIGHT NOTICE

At least a portion of the disclosure of this patent document contains material that is subject to copyright protection. The copyright owner has no objection to the facsimile reproduction by anyone of the patent document or the patent disclosure, as it appears in the Patent and Trademark Office patent files and/or records, but otherwise reserves all copyright rights whatsoever. The following notice applies to the software and data as described below and in the drawings that form a part of this document: Copyright Egis Group LLC. All rights reserved.

BACKGROUND OF THE DISCLOSURE

Mobile electrical systems such as marine vessels and motor vehicles typically utilize a chemical battery for providing electrical power to on board devices needed to operate the vehicle or vessel. In many applications the vehicle or vessel contains an engine that uses the battery power to start and in turn provides power back to the battery. Marine vessels are often constructed with two or more batteries or sets of batteries (banks) that can operate independently of each other.

Vessels with two or more engines often have separate starting batteries for each engine. Most vessels over 18 feet in length have a separate battery for supporting non-engine starting electrical loads, often terms a "house" battery and supplying electricity to radios, lights, navigation and communications equipment. The nature of the marine and other motor vehicle industries such as emergency responder vehicles (police, ambulance, fire) is to provide for redundancy in order to maximize the ability for the vehicle or the vessel to be is effective operational condition. This is the primary reason why separate battery systems are typically utilized.

Similarly, these vehicles or vessels often utilize redundant methods to maintain battery charge through multiple engines or separate charging methods such as "shore" AC plug-in-based battery chargers, solar panels, or wind generators. On the electrical loads placed within the vehicles or vessels, maximizing system availability often dictates further isolation of electrical load groups in order to ensure that one more critical group of devices is able to receive priority over less critical electrical loads should there be a shortage of electrical power on the vehicle or vessel.

The primary electrical systems of marine vessels and many motor vehicles are therefore often complex in nature and consequently require devices that are able to connect or disconnect the various power and charging sources such as batteries and battery charging devices from the various electrical loads within the system such as engine starters, house lighting, and navigation/communications equipment.

The marine and emergency vehicle industries have long utilized manual means for providing operator determination of which batteries and loads are turned on or off or connected to each other using operator driven mechanical battery disconnect switches, electro-mechanical relays, or silicon switching devices. These solutions worked well especially with the simple battery and electrical load configurations that were prevalent in the past.

More recently the electrical system complexity driven by increased safety requirements and increased number of battery charging sources and electrical load devices has driven interest and utilization of automatic methods for connecting and disconnecting the various primary elements described above. Devices described as voltage sensitive relays or automatic charging relays have taken over the function of connecting and disconnecting separate battery banks when a charge source is or is not present. Other devices described as low voltage disconnects, battery savers, or timed disconnects have taken over the function of disconnecting electrical loads when batteries are at a low state of charge.

The proliferation of autonomous electrical switching devices has simplified operation of these systems but has introduced other challenges for system designers and operators in a world where the space available to install and maintain these devices is increasingly being limited in order to maximize space for end users or vital equipment.

Moreover, each individual autonomous electrical switching device requires a minimum amount of electrical energy in order to continuously monitor inputs and outputs through sensors and make their intelligent decisions. When added up, the many individual devices can easily drain a battery over a fairly short period of time if the vehicle or vessel is not operated and left without an active battery charge source applied.

Finally, each individual switching device carries a cost overhead of a microprocessor, control input/output connections, and external high ampere connections many of which ultimately terminate to another autonomous switching device.

It is apparent that a need exists for a novel solution to provide a smaller, more cost effective solution to autonomous primary electrical system switching where two or more functions can be combined to reduce device interconnection space and cost and leverage processing power across multiple functions. The present disclosure is directed toward providing such a solution.

SUMMARY OF THE DISCLOSURE

The purpose of this disclosure is to provide the state of the art with a device that can simultaneously, with the least amount of physical change, be reconfigurable from a single circuit electrical switching device to a multiple circuit electrical switching device. Additionally, the purpose of this disclosure is to provide a device with a single microprocessor and multiple on board sensors capable of autonomously switching on board electrical switches based on internal sensor feedback and/or external user driven control inputs.

By offering two or more autonomous electrical switching devices in one self-contained device, this disclosure reduces total installed space, cost, and installation time for many typical system installations that require each function that would otherwise be solved through individual devices.

Through a solution that incorporates the same internal printed circuit board assembly for all potential application configurations, this device offers its manufacturer significant improvements in cost efficiency due to the ability to leverage higher volumes with fewer components. This allows the devices manufacturer to pass those cost efficiencies along to its customers and in turn achieve more cost efficiencies through increased sales of a more competitive overall solution.

The disclosure consists of two unique elements intended to be claimed separately. First, a printed circuit board assembly configured to operate two or more electrical switch functions to act independently or simultaneously; and for the printed circuit board assembly to be optionally able to be assembled into a housing where multiple independent circuits on the printed circuit board assembly can be permanently electrically connected to each other through electrical connection nuts thus reducing the number of independent circuits within the assembly. The assembly further consists of an electrically insulative housing and terminal studs and retaining nuts capable to receiving electrical cable ring terminals.

Second, this disclosure outlines a device that provides uniquely separate and autonomous functionality within one electrical switching device for the purposes of combining those functions into one unit. One embodiment of this device is to provide (a) automatic battery charge sharing/isolation between two batteries/charge sources while also providing (b) voltage or ignition sense electrical switching of electrical loads. A second embodiment of this device is to provide (a) automatic battery charge sharing/isolation between a first battery/charge source and a second battery/charge source while also providing (b) automatic battery charge sharing/isolation between a third battery/charge source and the second battery/charge source. A third embodiment of this device is to provide (a) voltage or ignition sense electrical switching of one isolated electrical load group from a battery or charge source. while also providing (b) voltage or ignition sense electrical switching of a second isolated electrical load group from a the same or different battery or charge source. A fourth embodiment of this device is to provide (a) voltage or ignition sense electrical switching of an isolated electrical load group from a first battery or charge source. while also providing (b) voltage or ignition sense electrical switching of the same isolated electrical load group from a second battery or charge source.

Some of the advantages of this disclosure are that (1) a singular high precision complex electron-mechanical device can be constructed and leveraged to solve a wide multitude of application requirements. This allows significantly improved cost efficiencies which can result in improved value to those who purchase this device. An additional significant advantage is that (2) the ability to combine more than one switching device within a purpose built enclosure able to sense battery voltage and make automatic decisions with respect to the open/close state of the switches leverages the cost of microprocessor electronics across more than one switching device. Additional benefits are achieved by eliminating technician and field wiring connections between multiple devices and replacing those connections with factory-controlled connections within the subject disclosure.

Thus, it is a primary object of the disclosure to provide a flexible intelligent electrical switching device with multi-function capability, and methods of use that improve upon the state of the art.

Another object of the disclosure is to provide a flexible intelligent electrical switching device with multi-function capability, and methods of use that are easy to use.

Yet another object of the disclosure is to provide a flexible intelligent electrical switching device with multi-function capability, and methods of use that provide a plurality of methods of using a system disclosed herein for simultaneously, with physical resistance, autonomously provide intelligent switching.

Another object of the disclosure is to provide a flexible intelligent electrical switching device with multi-function capability, and methods of use that is smaller than those that exist in the state of the art.

Yet another object of the disclosure is to provide a flexible intelligent electrical switching device with multi-function capability, and methods of use that provides a cost effective solution to autonomous primary electrical system switching.

Another object of the disclosure is to provide a flexible intelligent electrical switching device with multi-function capability, and methods of use that reduces needed interconnection space.

Yet another object of the disclosure is to provide a flexible intelligent electrical switching device with multi-function capability, and methods of use that utilizes less processing power than others switches in the state of the art.

Another object of the disclosure is to provide a flexible intelligent electrical switching device with multi-function capability, and methods of use that allows for optional manual switching of electrical loads.

Yet another object of the disclosure is to provide a flexible intelligent electrical switching device with multi-function capability, and methods of use that allows for optional manual switching of electrical loads for marine vessels.

Another object of the disclosure is to provide a flexible intelligent electrical switching device with multi-function capability, and methods of use that allows for optional manual switching of electrical loads for motor vehicles.

Yet another object of the disclosure is to provide a flexible intelligent electrical switching device with multi-function capability, and methods of use that can operate with one or more battery system.

Another object of the disclosure is to provide a flexible intelligent electrical switching device with multi-function capability, and methods of use that can function with more a single, or more than one, electrical group.

Yet another object of the disclosure is to provide a flexible intelligent electrical switching device with multi-function capability, and methods of use that can combine two or more internal switching elements into one.

Another object of the disclosure is to provide a flexible intelligent electrical switching device with multi-function capability, and methods of use that combines two or more internal switching elements into one with few components.

Yet another object of the disclosure is to provide a flexible intelligent electrical switching device with multi-function capability, and methods of use that combines two or more internal switching elements using a single switching printed circuit board.

Another object of the disclosure is to provide a flexible intelligent electrical switching device with multi-function capability, and methods of use that is of singular construction.

Yet another object of the disclosure is to provide a flexible intelligent electrical switching device with multi-function capability, and methods of use that caters to a wide variety of application requirements.

Another object of the disclosure is to provide a flexible intelligent electrical switching device with multi-function capability, and methods of use that senses battery voltage.

Yet another object of the disclosure is to provide a flexible intelligent electrical switching device with multi-function capability, and methods of use that can process inputs and change functionality as a part of the processed inputs.

Another object of the disclosure is to provide a flexible intelligent electrical switching device with multi-function capability, and methods of use that can autonomously open and close switches.

Yet another object of the disclosure is to provide a flexible intelligent electrical switching device with multi-function capability, and methods of use that provides microprocessing capabilities.

Another object of the disclosure is to provide a flexible intelligent electrical switching device with multi-function capability, and methods of use that eliminates the need for field wiring.

Yet another object of the disclosure is to provide a flexible intelligent electrical switching device with multi-function capability, and methods of use that is relatively inexpensive.

Another object of the disclosure is to provide a flexible intelligent electrical switching device with multi-function capability, and methods of use that can be used in a variety of applications.

Yet another object of the disclosure is to provide a flexible intelligent electrical switching device with multi-function capability, and methods of use that can be implemented in a variety of circumstances with ease of installation.

These and other objects, features, or advantages of the present disclosure will become apparent from the specification and claims.

DETAILED DESCRIPTION OF THE DISCLOSURE

Figure 1:
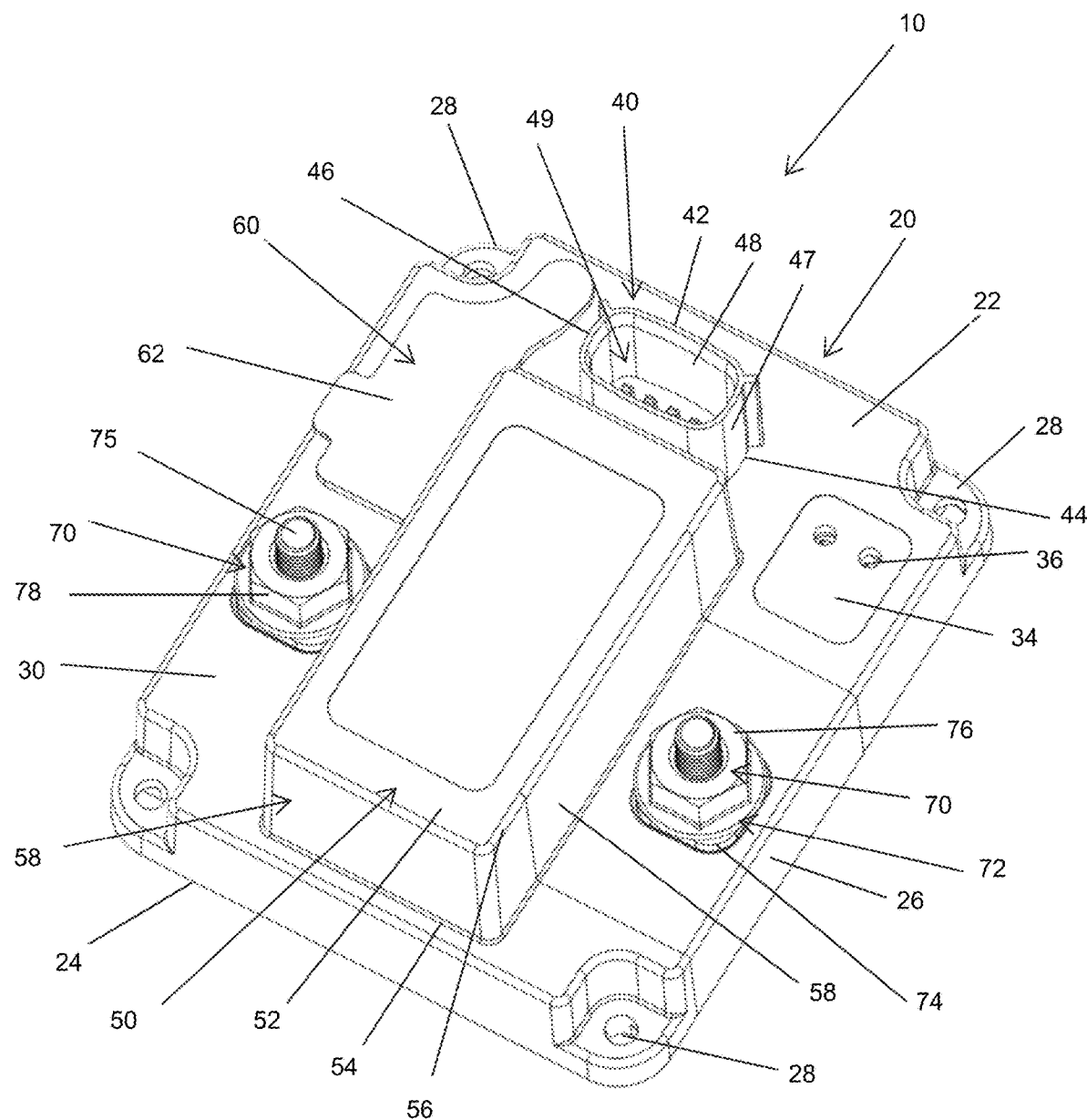
FIG. 1 is a top perspective view of a flexible intelligent electrical switching device with multi-functional capability; the view showing a single terminal embodiment; the view showing a housing; the view showing a program cover; the view showing a power terminal.
Figure 2:
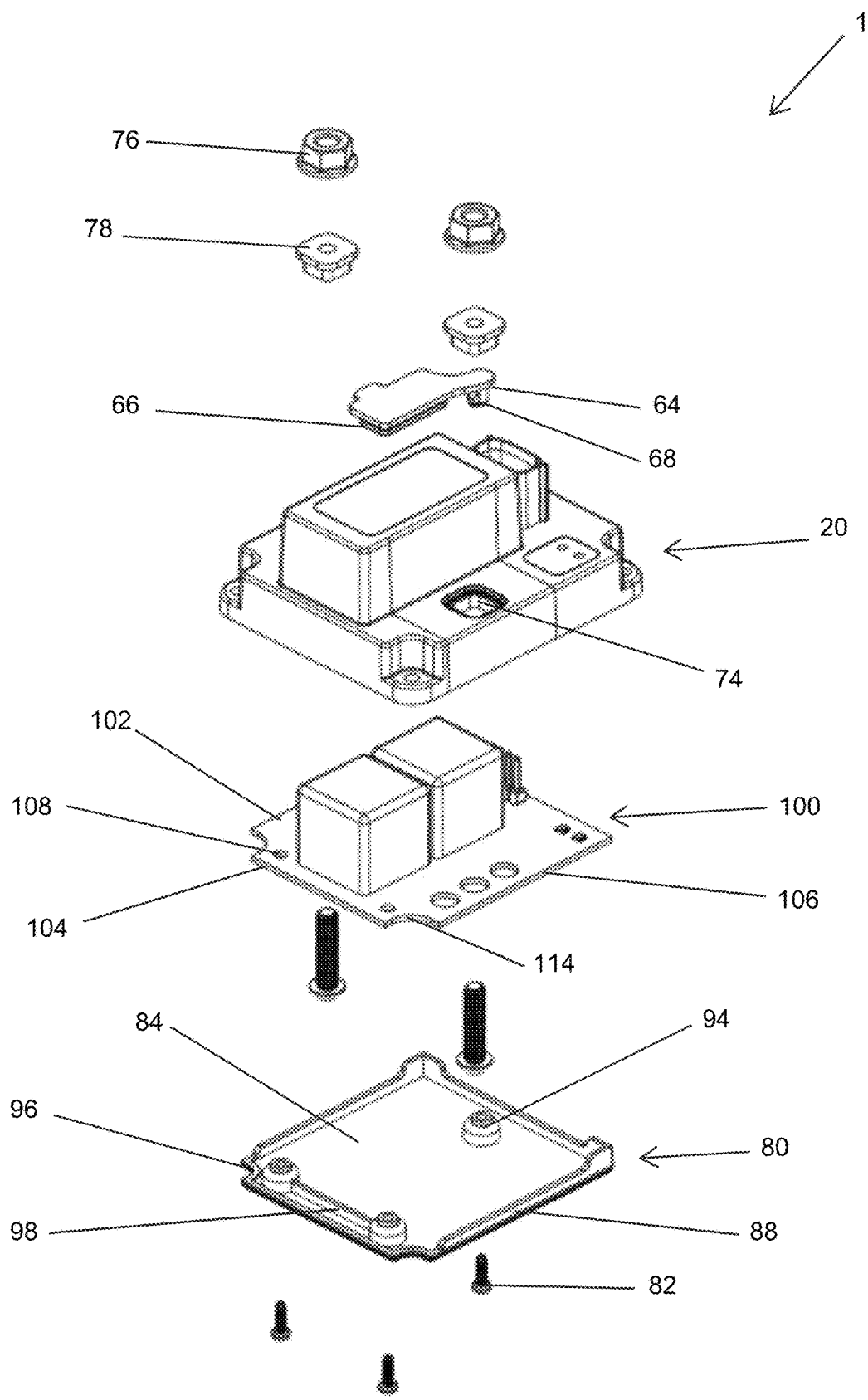
FIG. 2 is an exploded, perspective view of a flexible intelligent electrical switching device with multi-functional capability; the view showing a single terminal embodiment; the view showing a housing; the view showing a program cover; the view showing a power terminal; the view showing a circuit board assembly; the view showing a bottom cover.

In the following detailed description, reference is made to the accompanying drawings which form a part hereof, and in which is shown by way of illustration specific embodiments in which the disclosure may be practiced. These embodiments are described in sufficient detail to enable those skilled in the art to practice the disclosure, and it is to be understood that other embodiments may be utilized and that mechanical, procedural, and other changes may be made without departing from the spirit and scope of the disclosure(s). The following detailed description is, therefore, not to be taken in a limiting sense, and the scope of the disclosure(s) is defined only by the appended claims, along with the full scope of equivalents to which such claims are entitled.

As used herein, the terminology such as vertical, horizontal, top, bottom, front, back, end, sides and the like are referenced according to the views, pieces and figures presented. It should be understood, however, that the terms are used only for purposes of description, and are not intended to be used as limitations. Accordingly, orientation of an object or a combination of objects may change without departing from the scope of the disclosure.

Reference throughout this specification to "one embodiment," "an embodiment," "one example," or "an example" means that a particular feature, structure, or characteristic described in connection with the embodiment or example is included in at least one embodiment of the present disclosure. Thus, the appearance of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

Embodiments in accordance with the present disclosure may be embodied as an apparatus, method, or computer program product. Accordingly, the present disclosure may take the form of an entirely hardware-comprised embodiment, an entirely software-comprised embodiment (including firmware, resident software, micro-code, etc.), or an embodiment combining software and hardware aspects that may all generally be referred to herein as a "circuit," "module," or "system." Furthermore, embodiments of the present disclosure may take the form of a computer program product embodied in any tangible medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. Computer program code for carrying out operations of the present disclosure may be written in any combination of one or more programming languages. Such code may be compiled from source code to computer-readable assembly language or machine code suitable for the device or computer on which the code will be executed.

Embodiments may also be implemented in cloud computing environments. In this description and the following claims, "cloud computing" may be defined as a model for enabling ubiquitous, convenient, on-demand network access to a shared pool of configurable computing resources (e.g., networks, servers, storage, applications, and services) that can be rapidly provisioned via virtualization and released with minimal management effort or service provider interaction and then scaled accordingly. A cloud model can be composed of various characteristics (e.g., on-demand self-service, broad network access, resource pooling, rapid elasticity, and measured service), service models (e.g., Software as a Service ("Saas"), Platform as a Service ("PaaS"), and Infrastructure as a Service ("IaaS")), and deployment models (e.g., private cloud, community cloud, public cloud, and hybrid cloud).

The flowchart and block diagrams in the attached figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

All illustrations of the drawings are for the purpose of describing selected versions of the present disclosure and are not intended to limit the scope of the present disclosure.

The following descriptions are in reference to FIG. 1 through FIG. 13. The present disclosure is a flexible intelligent electrical switching device with multi-functional capability designed to simultaneously serve as a single circuit electrical switching device as well as a multi-circuit switching device. Said another way, with the least amount of physical change and/or energy requirements, the device is able to autonomously change from a single circuit electrical switching device to a multi-circuit electrical switching device.

Additionally, and with reference to the figures, the present disclosure includes an onboard microprocessor and multiple onboard sensors capable of detecting inputs and processing these inputs. Furthermore, the microprocessor determines actions based on these inputs and can autonomously change the functionality of the device based on these inputs detected by various sensors. Additionally, this internal feedback can be used for optional manual switching or manual override.

Although the disclosure has been explained in relation to its preferred embodiment, it is to be understood that many other possible modifications and variations can be made without departing from the spirit and scope of the disclosure.

System

With reference to the figures, a flexible intelligent electrical switching device with multi-function capability system 10, and methods of use is presented (hereafter known as "switch system" or simply "system"). Switch system 10 is formed of any suitable size, shape and design and is configured to autonomously change the functionality of the device based on these inputs detected by various sensors.

In the arrangement shown, as one example, system 10, which may comprise remote servers, databases, application servers, application databases, application programming interfaces, product databases, mobile applications, and/or computers that fulfill the functions disclosed herein, also includes, in the embodiment depicted, a housing 20, a program cover 60, a power terminal 70, a bottom cover 80, and a circuit board assembly 100, among other components.

In the arrangement shown, as one example, system 10 comprises remote servers, databases, and/or computers that fulfill the functions disclosed and described herein as well as providing for manual override controls of the system. Additionally, System 10 may comprise an application server. Application server comprises one or more computer systems adapted to transmit and receive data regarding selected datasets related to various users and/or datasets related to multiple users. Application server is adapted to query database with unique identification codes to retrieve inputs and/or processed information by the onboard microprocessing unit. Application server is also adapted to query a database for a history of functionality of system 10. Additionally, the application server may communicate with a mobile application, which is adapted to present the product information in a form conducive to being viewed on a mobile device and/or handheld device.

The appearance of the presentation of the product information and/or the process windows for researching hundreds of inputs and/or processes and/or functionality and/or current operation status may be customized with data of particular relevance to the user and/or the device and/or the power supply and/or the loads being supplied by power traveling through the system 10. As one example, the appearance of windows and/or the process for researching hundreds of inputs may be customized for various information, trending information, and/or historical information related to current functionality status and/or current flow data, and/or other information sensed and processed by system 10.

As one of ordinary skill in the art may understand, application server and databases mentioned herein may be implemented in one or more servers. Additionally, multiple servers may have mirrored data to prevent data loss in case of disk failure and/or to decrease access and response times for database queries. In alternative embodiments, application server, and other database procedures may be carried out on computer-readable instructions and data stored on the customer's mobile computing device. Additionally, system 10 may include an application programming interface ("API") which includes tools and resources enabling a user to operate the embodiments and/or view information related to the embodiments herein.

Housing:

In the arrangement shown, as one example, system 10 includes a housing 20. Housing 20 is formed of any suitable size, shape, and design and is configured to house and hold the components of system 10. In the arrangement shown, as one example, housing 20 includes a top 22, a bottom 24, a peripheral edge 26, a plurality of attachment features 28, an exterior surface 30, a hollow interior 32, an access panel 34, a plurality of attachment features 36 of the access panel 34, a terminal guard 38, a control signal connector cover 40, a top 42 of the control signal connector cover 40, a bottom 44 of the control signal connector 40, a peripheral edge 46 of the control signal connector cover 40, an exterior surface 47 of the control signal connector cover 40, an interior surface 48 of the control signal connector cover 40, a hollow interior 49 of the control signal connector cover 40, a switch housing extension 50, a top 52 of the switch housing extension 50, a bottom 54 of the switch housing extension 50, a peripheral edge 56 of the switch housing extension 50, an exterior surface 57 of the switch housing extension 50, a hollow interior 58 of the switch housing extension 50, among other components and features.

In the arrangement shown, housing 20 is formed of a thin, singular construction of molded polymer. However, any other construction and/or material is hereby contemplated for use for a housing 20. In fact, in some circumstances a more durable housing 20 may be required. A housing 20 of steel, carbon fiber, or other composite capable of heat resistance, electrical insulation, water proofing, and the like may be necessary in various applications, especially those found in marine vessels and other transportation vehicles which can be very exposed to the elements such as heat and/or cold. Many of the applications of this product are needed in difficult climates.

In the arrangement shown, as one example, housing 20 extend from a top 22 to a bottom 24 and is lined around the perimeter by a wall which is the peripheral edge 26. The peripheral edge extends from the top 22 to the bottom 24. Additionally, and as shown in the arrangement, the housing 20 includes a plurality of attachment features 28. Attachment features 28 are formed of any suitable size, shape, and design and are configured to attach housing 20 securely to a surface. Said another way, attachment features 28 are configured to attach housing 20 and all of the components within, or attached to the surface of the housing 20, to a surface. Attachment features 28 include, but are not limited to, openings for fastening the housing 20 to a surface, fasteners, adhesives, form fitting, friction fitting, and the like and other methods for attaching and/or securing the housing to a desired surface and/or location.

In the arrangement shown, as one example, housing 20 also includes an access panel 34. Access panel 34 is formed of any suitable size, shape, and design and is configured to provide access to the interior from the exterior of the housing 20. In other words, and as shown in the example, access panel 34 provides access to the components housed within the housing 20. In the arrangement shown, as one example, access panel 34 is a small square cut-out located along the top 22 surface of the housing 20. In this way, the access panel 34 will be exposed even when the housing 20 is attached to a surface in a preferred way. In the arrangement shown, as one example, access panel 34 includes attachment features 36. These attachment features 36 are designed to be re-usable so that a user can remove and replace access panel 34 a plurality of times for replacement, maintenance, and the like.

In the arrangement shown, as one example, housing 20 includes a terminal guard 38. Terminal guard 38 is formed of any suitable size, shape, and design, and is configured to provide separation between multiple terminals. In the arrangement shown, as one example, housing 20 includes 1 terminal guard 38. However, any number of terminal guards 38 that are necessary for applications are hereby contemplated for use. This includes having 2 terminal guards, 3 terminal guards, 4 terminal guards, or more.

Figure 3:
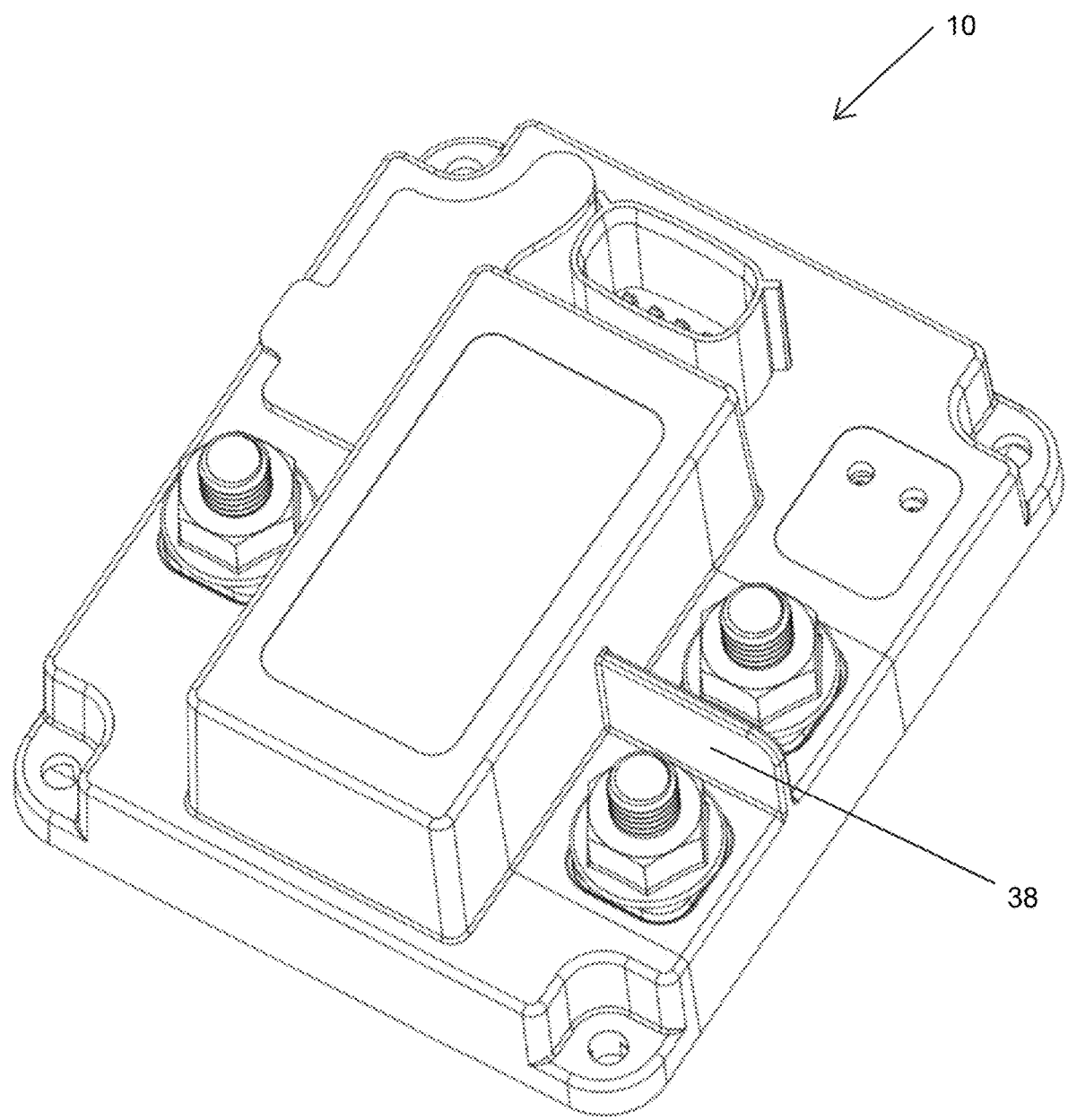
FIG. 3 is a top perspective view of a flexible intelligent electrical switching device with multi-functional capability; the view showing a multi-terminal embodiment; the view showing a housing; the view showing a program cover; the view showing a power terminal.
Figure 4:
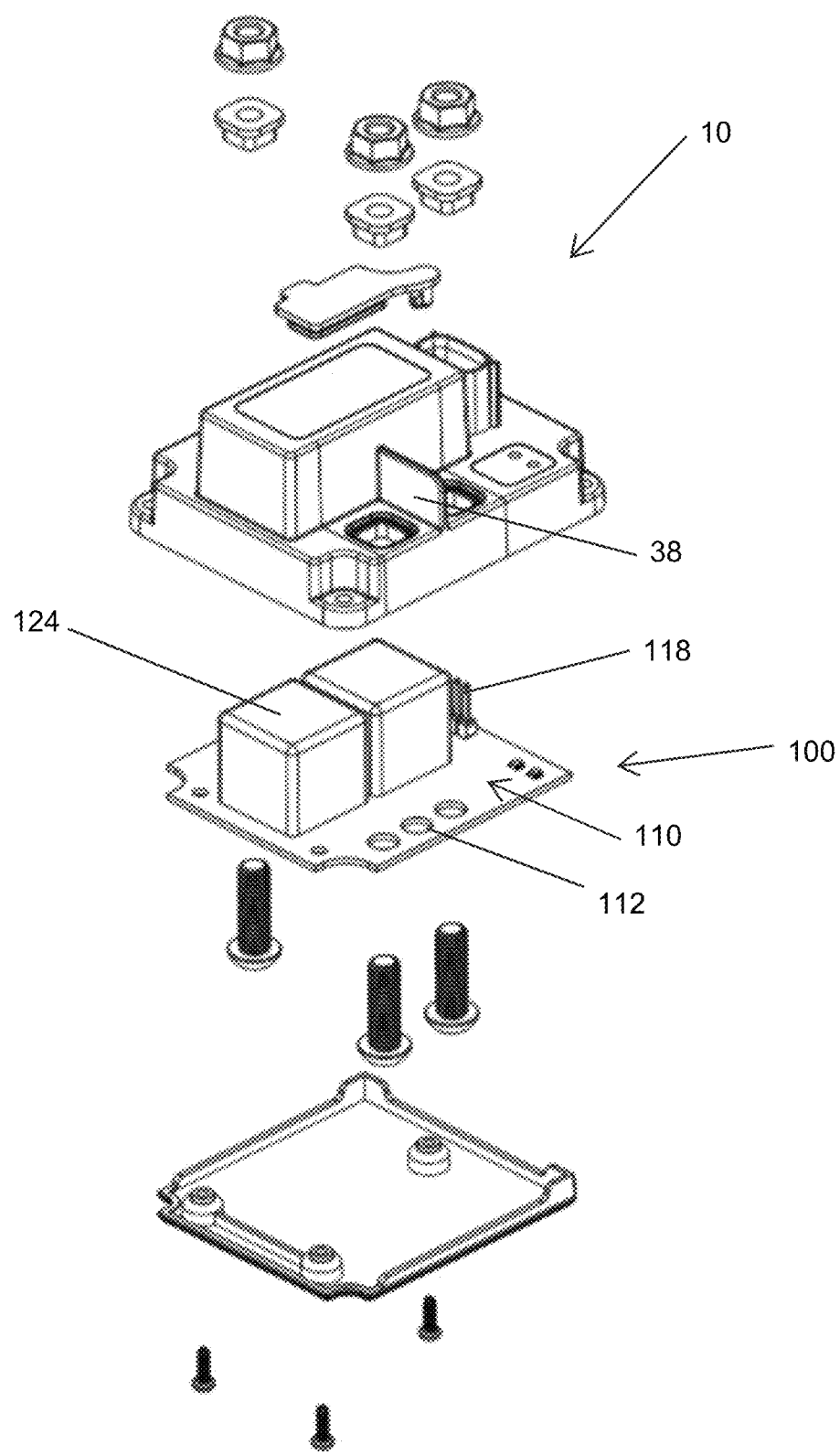
FIG. 4 is an exploded, perspective view of a flexible intelligent electrical switching device with multi-functional capability; the view showing a multi-terminal embodiment; the view showing a housing; the view showing a program cover; the view showing a power terminal; the view showing a circuit board assembly; the view showing a bottom cover.
Figure 5:
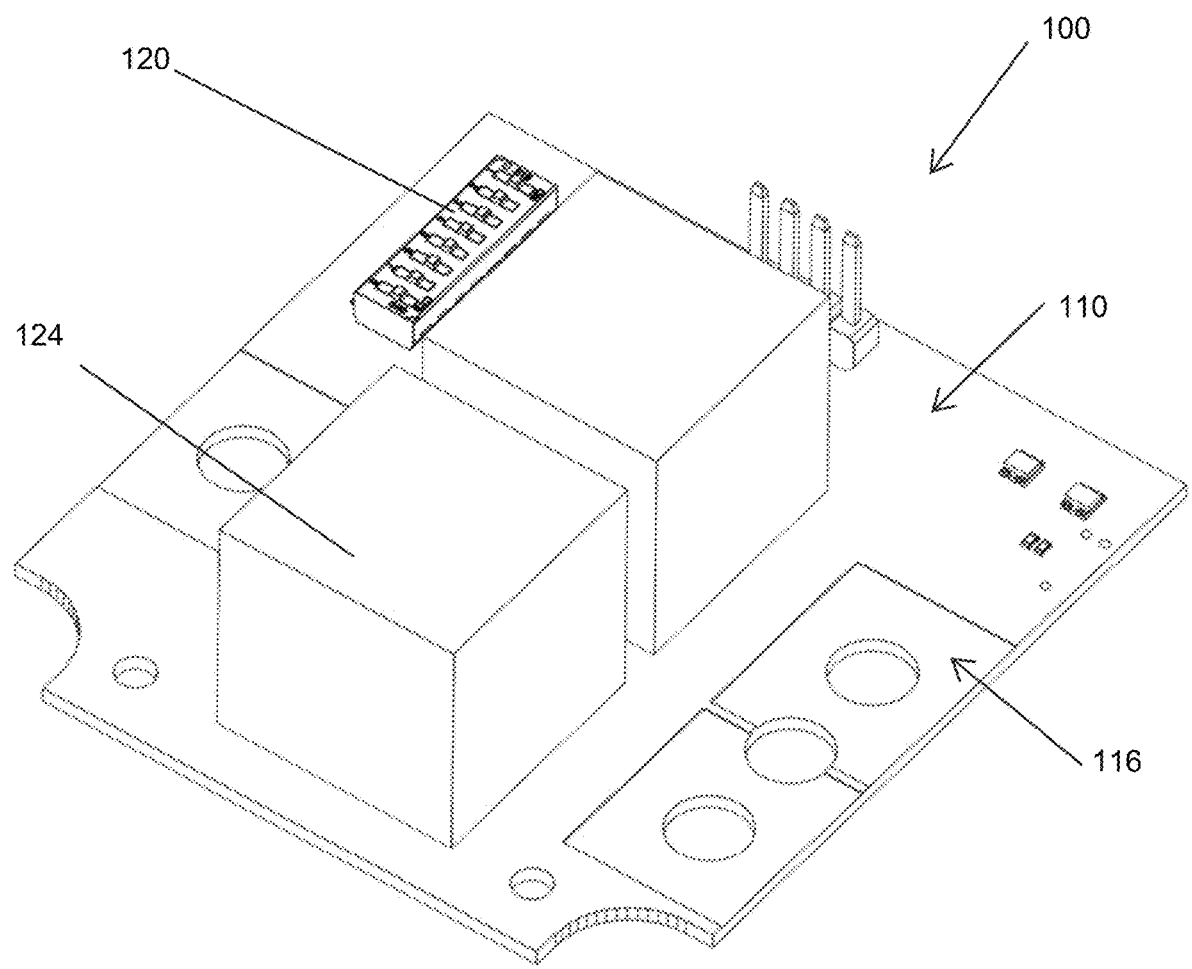
FIG. 5 is a top perspective view of a circuit board assembly; the view showing a printed circuit board; the view showing terminal receiver openings; the view showing guide features; the view showing contact pads; the view showing a control signal connector; the view showing programming dip switches; the view showing at least one switch.
Figure 6:
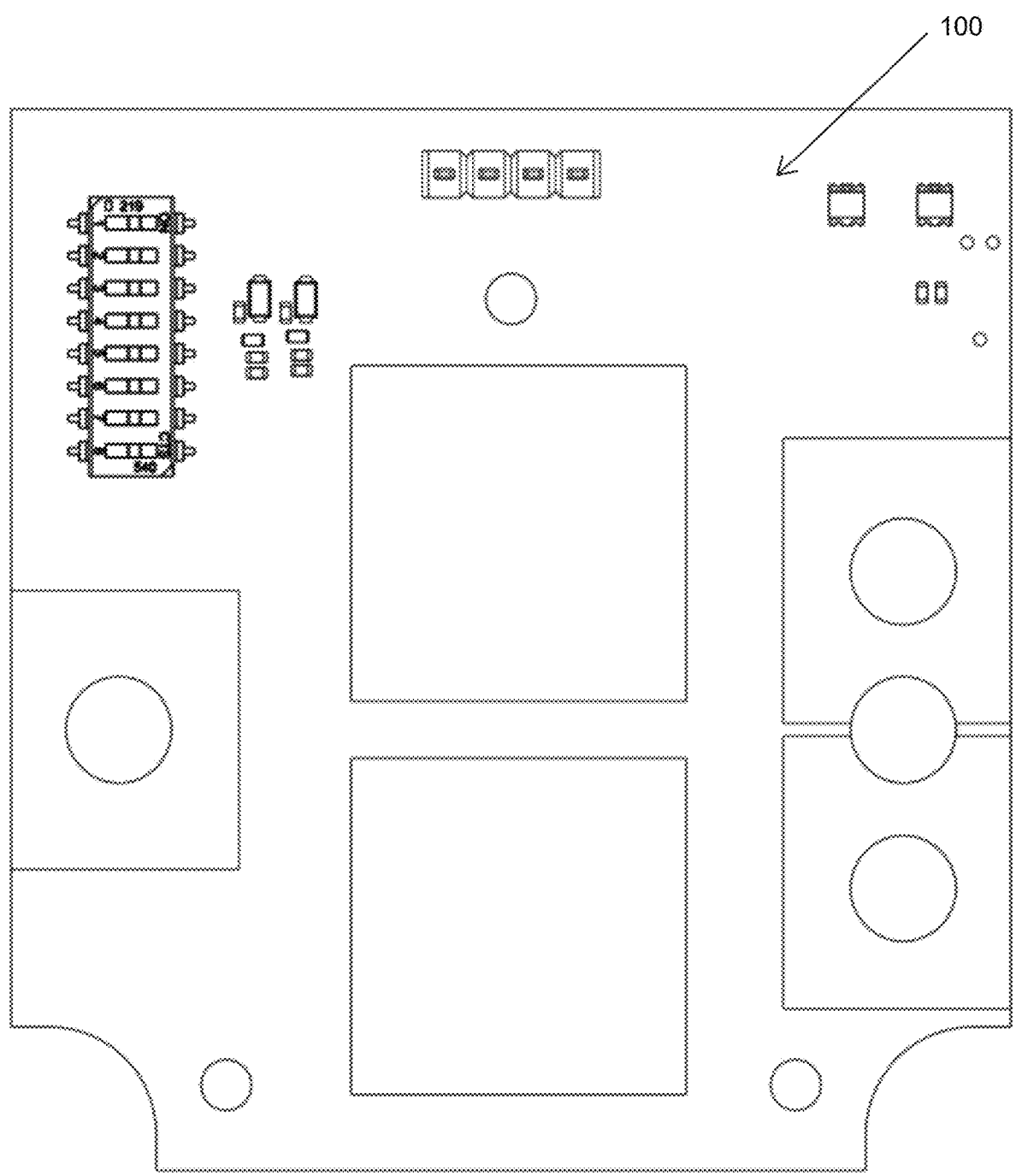
FIG. 6 is a top view of a circuit board assembly; the view showing a printed circuit board; the view showing terminal receiver openings; the view showing guide features; the view showing contact pads; the view showing a control signal connector; the view showing programming dip switches; the view showing at least one switch.
Figure 7:
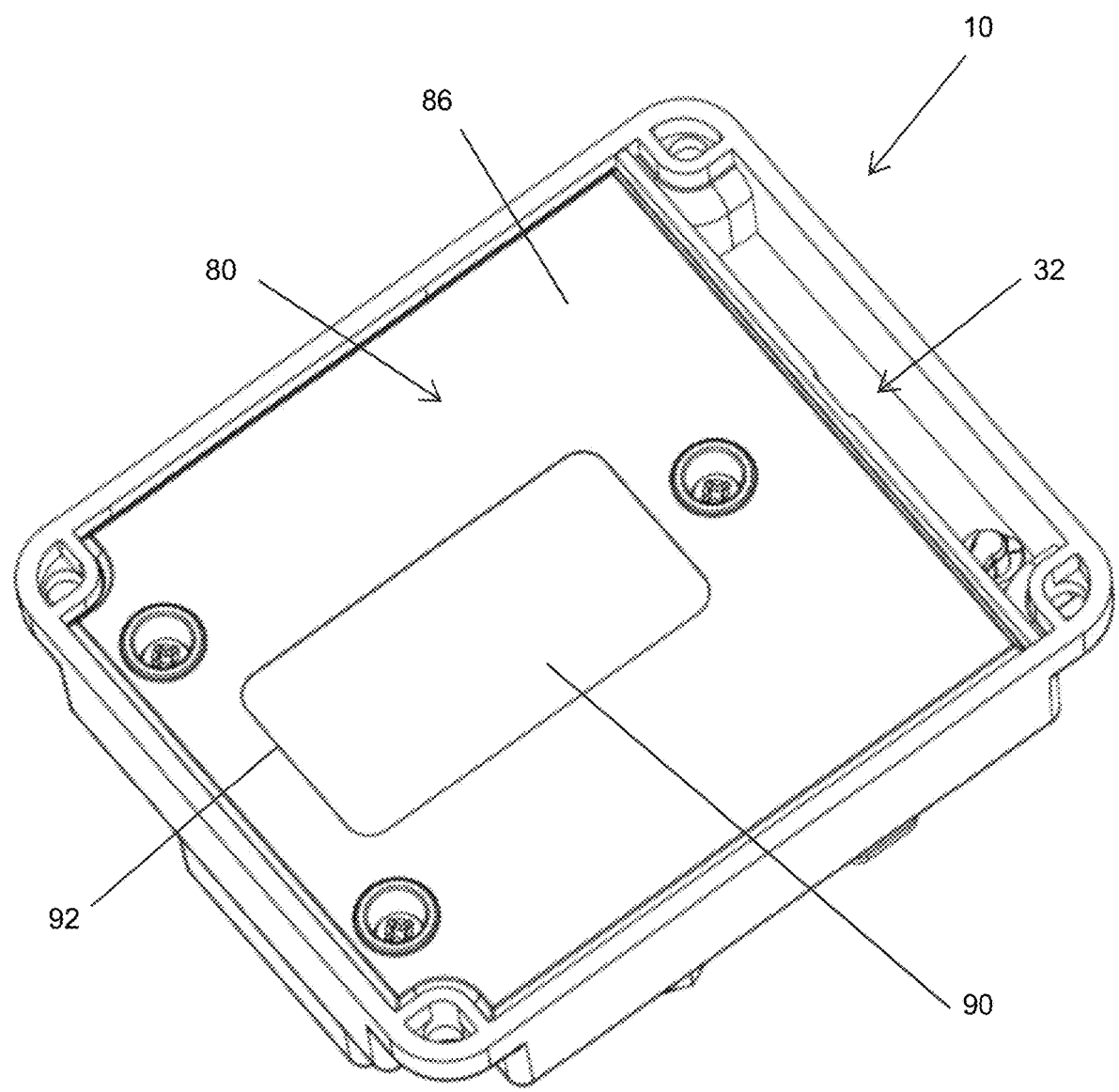
FIG. 7 is a bottom perspective view of a flexible intelligent electrical switching device with multi-functional capability; the view showing a housing; the view showing a bottom; cover.
Figure 8:
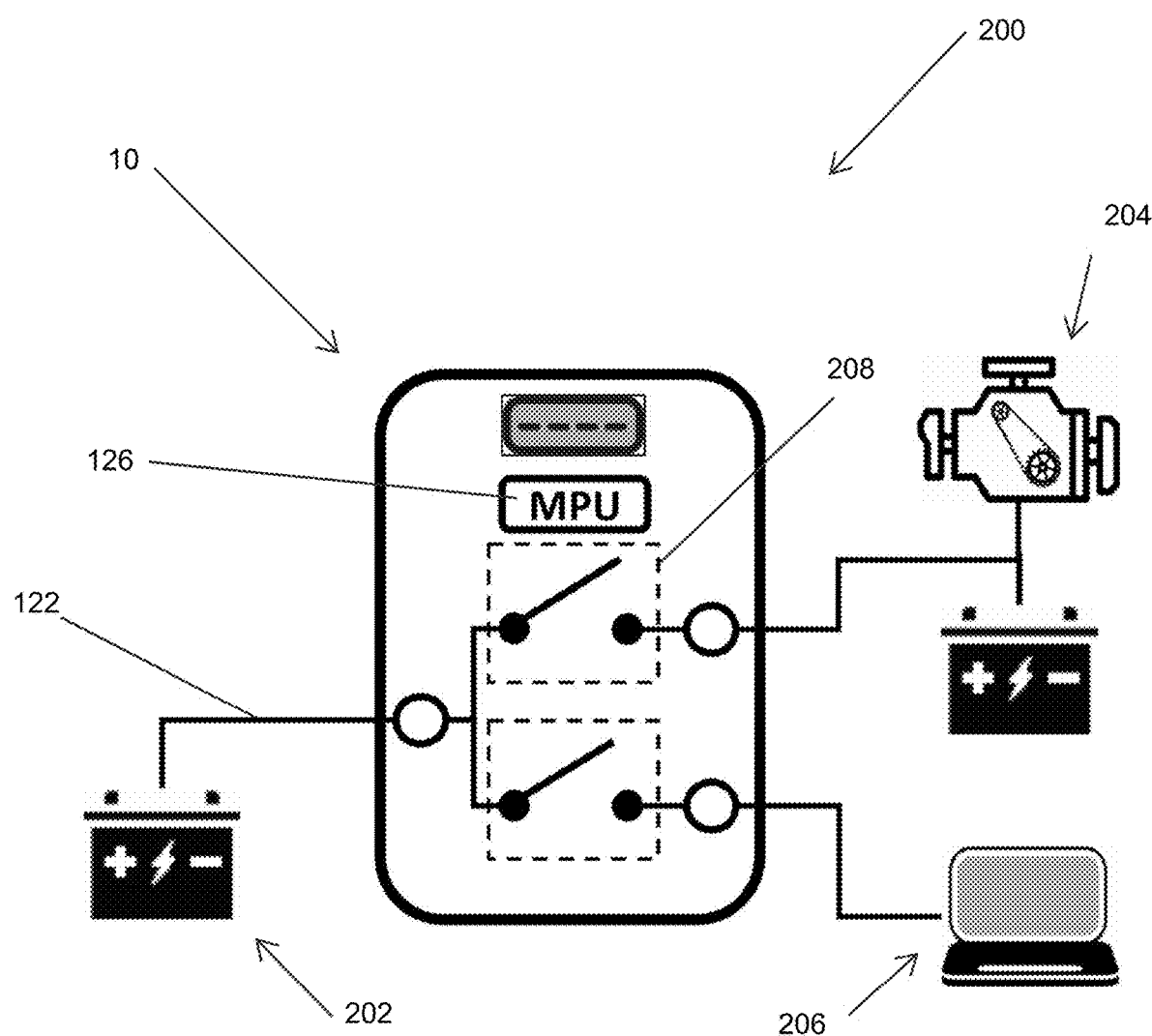
FIG. 8 is a diagram illustrating an embodiment deploying the disclosure; the view showing at least one power supply; the view showing a start system; the view showing at least one load; the view showing at least one functional element; the view showing a microprocessing unit.

Additionally, and in the arrangement shown, terminal guard 38 is formed in unitary construction with the housing 20 and is a slender extension of housing material vertically from the top 22 of the housing 20, as is shown in FIG. 3. However, terminal guard 38 may be formed as a separate feature capable of attachment to the housing 20, or the like in a manner that allows for modification of the housing 20, as is necessary in various applications.

In the arrangement shown, as one example, housing 20 includes a control signal connector cover 40. Control signal connector cover 40 is formed of any suitable size, shape, and design and is configured to protect and securely attach a connection to the control signal connector 118, which is further discussed herein. Control signal connector cover 40 extends vertically from the top 22 of the housing 20 as a unitary construction. In this way, the bottom 44 of control signal connector cover 40 is adjacent to the top 22 surface of the housing 20. In this way, the control signal connector cover 40 extends vertically from the housing 20 along a peripheral edge 46 of the control signal connector 40 that forms as a frictional, stabilizing, and protection source for the control signal connector 118 and attachment to the control signal connector 118. Additionally, the control signal connector cover 40 includes a top 42, an exterior surface 47, an interior surface 48, and a hollow interior 49.

In the arrangement shown, as one example, housing 20 also includes a switch housing extension 50. Switch housing extension 50 is formed of any suitable size, shape, and design and is configured to house and hold the switching and functionality devices housed within the housing 20. In other words, and in the arrangement shown, switch housing extension 50 is an extension of space, appearing as a large bump, protruding out of the top 22 surface of the housing 20 such that the switch housing extension 50 creates a larger interior space for components to be held in. In the arrangement shown, the switch housing extension is formed of a unitary construction and as an extension of the housing 20. However, other forms of this extension, including modifiable components to house various sized components within the housing 20 are hereby contemplated for use. In the arrangement shown, the switch housing extension 50 includes a top 52, a bottom 54 which is adjacent to the top 22 of housing 20, a peripheral edge 54, an exterior surface 57 and a hollow interior 58 within the switch housing extension 50.

Program Cover:

In the arrangement shown, as one example, system 10 includes a program cover 60. Program cover 60 is formed of any suitable size, shape, and design and is configured to provide access to the interior components such that a user can access and change system 10 settings. In the arrangement shown, as one example, program cover 60 includes a top 62, a bottom 64, a lip 66, and connection features 68, among other components and features.

In the arrangement shown, as one example, program cover 60 is formed of a thin, singular construction of molded polymer. However, any other construction and/or material is hereby contemplated for use for a program cover 60. In fact, in some circumstances a more durable program cover 60 may be required. A program cover 60 of steel, carbon fiber, or other composite capable of heat resistance, electrical insulation, water proofing, and the like may be necessary in various applications, especially those found in marine vessels and other transportation vehicles which can be very exposed to the elements such as heat and/or cold. Many of the applications of this product are needed in difficult climates.

In the arrangement shown, as one example, program cover 60 is a flat, plate-like cover lined around the perimeter with a lip feature 66 which is designed to aid the cover in sitting in place in an opening within the housing 20. Additionally, the lip 66 may serve as an attachment feature by frictional fit or snap fit to the housing 20.

Additionally, and as shown in the arrangement, the program cover 60 includes a plurality of attachment features 68. Attachment features 68 are formed of any suitable size, shape, and design and are configured to attach the program cover 60 securely to the housing 20. Said another way, attachment features 68 are configured to attach program cover 60 to the housing 20 and protect and give access to all of the components within. Attachment features 68 include, but are not limited to, openings for fastening the program cover 60 to the top 22 surface of the housing 20 or other portion of the housing 20 where program cover 60 may be positioned. Attachment features 68 may include the lip 66 alone as an attachment feature, other fasteners, adhesives, form fitting, friction fitting, and the like and other methods for attaching and/or securing the program cover 60 to a desired surface and/or location of the housing 20. Additionally, and in the arrangement shown, attachment features 68 may include openings in the program cover for other fasteners or components to fit through or therein.

Power Terminal:

In the arrangement shown, as one example, system 10 includes a power terminal 70. Power terminal 70 is formed of any suitable size, shape, and design and is configured to receive electrical power cable ring terminals and/or other power terminals and/or cables and/or connections which may be secured with flange nuts 78. In the arrangement shown, as one example, power terminal 70 includes a plurality of attachment features 72, a terminal housing 74, terminal bolts 75 or terminal studs 75, terminal nuts 76 and/or flange nuts 78.

In the arrangement shown as one example, power terminal 70 includes a terminal housing 74. Terminal housing 74 is formed of any suitable size, shape, and design and is configured to provide an electrical connection and/or continuation point as well as house and hold an attachment for the cable or electrical current device. In the arrangement shown, as one example, terminal housing 74 is a conductive plate with an opening for a bolt and/or receiver to fit within. Terminal housing 74 is the location in the figures shown that power supplies and loads are connected to system 10.

In the arrangement shown, as one example, power terminal 70 includes 2 or 3 power terminals 70. However, any other number of power terminals 70 which are needed for the arrangement are hereby contemplated for use, including, 4 power terminals, 5 power terminals, 6 power terminals, or more power terminals. Additionally, in the arrangement shown, as one example, power terminals 70 are a nut and bolt configuration with cable ring attachment design. However, other types of power connections are hereby contemplated for use, including but not limited to, frictional fitting, soldered connections, spring-loaded connections, any combination therrein and the like.

Bottom Cover:

In the arrangement shown, as one example, system 10 includes a bottom cover 80. Bottom cover 80 is formed of any suitable size, shape, and design and is configured to attach to the circuit board assembly 100 and serve as the main platform for which all the components are attached to. In this way, the bottom cover 80 serves as the main surface for mounting, assembling, and configuring of many of the components of system 10. In the arrangement shown, as one example, bottom cover 80 includes attachment features 82, a top 84, a bottom 86, a peripheral edge, an access panel 90, attachment features 92 of the access panel 90, connection features 94, guidance features 96, and support features 98, among other components and features.

In the arrangement shown, as one example, bottom cover includes attachment features 82. Attachment features 82 are formed of any suitable size, shape, and design and are configured to secure the bottom cover 80 to the housing 20. In the arrangement shown, as one example, attachment features are three screws through openings in the bottom cover 80 that attach the bottom cover 80 to the housing 20. However, other attachment features 82 such as fasteners, adhesives, frictional fit, snap fit and the like are hereby contemplated for use for attaching the bottom cover 80 to the housing 20.

In the arrangement shown, as one example, the bottom cover 80 includes an access panel 90. Access panel 90 is formed of any suitable size, shape, and design and is configured to provide access to the interior from the exterior of the housing 20. In other words, and as shown in the example, access panel 90 provides access to the components housed within the housing 20 within the bottom cover 80. In the arrangement shown, as one example, access panel 90 is a small square cut-out located along the bottom 86 surface of the bottom cover 80. In the arrangement shown, as one example, access panel 90 includes attachment features 92. These attachment features 92 are designed to be re-usable so that a user can remove and replace access panel 90 a plurality of times for replacement, maintenance, and the like.

In the arrangement shown, as one example, bottom cover 80 may also include connection features 94. Connection features 94 are formed of any suitable size, shape, and design and are configured to securely connect the peripheral edge 88 of the bottom cover 80 to the housing 20. In this way, connection features 94 may be frictional and/or snap features and/or guide features along the peripheral edge 88. In this way, connection features 84 may provide for waterproofing in some conditions and/or temperature and/or electrical insulating.

In the arrangement shown, as one example, bottom cover 80 may also include guidance features 96 and support features 98. Guidance features 96 and support features 98 are formed of any suitable size, shape, and design and are configured to provide guidance and support as system 10 is assembled, disassembled, maintained, and the like. Additionally, guidance features 96 and support features 98 stabilize and make system 10 more rigid. In the arrangement shown, as one example, guidance features are quarter-circular in shape along two corners of the bottom cover 80 so as to fit and make assembly instructions clear because these two corners are unique and fit uniquely with the housing 20, which also has these features. In the arrangement shown, as one example, support features 98 are formed of perpendicular and/or thickened portions, which serve as rigid components for stabilizing.

Circuit Board Assembly:

In the arrangement shown, as one example, system 10 includes a circuit board assembly 100. Circuit board assembly 100 is formed of any suitable size, shape, and design and is configured to conduct inputs and outputs, process input information, create outputs, autonomously modify switching and functionality and alter electrical conductance. In the arrangement shown, as one example, the circuit board assembly 100 includes a top 102, a bottom 104, a peripheral edge 106, attachment features 108, a printed circuit board 110 (or "PCB"), a plurality of terminal receiving openings 112, guide features 114, contact pads 116, at least one control signal connector 118, programming dip switches 120, a plurality of traces 122, and at least one switch 124, among other components and features.

In the arrangement shown, as one example, circuit board assembly 100 includes attachment features 108. Attachment features 108 are formed of any suitable size, shape, and design and are configured to secure the circuit board assembly 100 in place as well as attach the bottom cover 80 and the housing 20 and/or other components. In the arrangement shown, as one example, attachment features 108 are three screws through openings in the bottom cover 80 that attach the bottom cover 80 to the housing 20, sandwiching the circuit board assembly 100 and passing through the circuit board assembly 100 as is shown in the exploded FIGS. 2 and 4. While screws are shown, other attachment features 108 such as fasteners, adhesives, frictional fit, snap fit and the like are hereby contemplated for use for attaching the bottom cover 80 to the housing 20. Additionally, other orientations of attachment features 108 are also hereby contemplated for use.

In the arrangement shown, as one example, circuit board assembly 100 includes a printed circuit board 110. Printed circuit board 110 is formed of any suitable size, shape, and design and is configured to facilitate carrying and/or holding other components and/or parts necessary to carry out the functions of system 10.

Printed circuit board 110, as one example, might be a surface mounted printed circuit board 110 or a through-hole printed circuit board. Printed circuit board 110, as one example, is green and facilitates connecting the components and/or parts of system 10 by the use of traces 122. Traces 122 are formed of any suitable size, shape and design and are configured as lines electrically connecting the components and/or parts of system 10. Generally, as in shown, traces 122 are soldered to connect the components and/or parts to the printed circuit board 110.

In the arrangement shown, as one example, circuit board assembly 100 includes terminal receiving openings 112. Terminal receiving openings 112 are formed of any suitable size, shape, and design and are configured to provide openings for the terminal studs 75 to pass through. In the arrangement shown, as one example, the terminal receiving openings 112 are circular in shape and are the approximate size to accommodate the terminal studs 75. However, other sizes, shapes, and designs are hereby contemplated for use. Terminal receiving openings 112 are not in direct contact with the contact pads 116, further discussed herein, but instead come into close proximity with contact pads 116.

In the arrangement shown, as one example, circuit board assembly 100 includes at least one guide feature 114. Guide features 114 are formed of any suitable size, shape, and design and are configured to provide guidance and support to the circuit board assembly 100 as is assembled, disassembled, maintained, and the like. Additionally, guide features 114 stabilize and make circuit board assembly 100 more rigid. In the arrangement shown, as one example, guide features 114 are quarter-circular in shape along two corners of the printed circuit board 110 so as to fit and make assembly instructions clear because these two corners are unique and fit uniquely with the housing 20, which also has these features.

In the arrangement shown, as one example, circuit board assembly 100 includes at least one contact pad 116. Contact pads 116 is formed of any suitable size, shape, and design and are configured to conduct electricity and electrical signals to the printed circuit board 110 via traces 122 and/or switches.

In the arrangement shown, as one example contact pads 116 are each designed to surround the terminal receiving openings 112. In the arrangement shown, contact pads 116 are situated on both the top and bottom sides of the printed circuit board 110. Further, the contact pads 116, in the arrangement shown, do not surround the terminal receiving openings 112, but instead are aligned in close proximity to the terminal receiving openings 112. Additionally, and in the arrangement shown, the contact pads 116 do not come into contact with other contact pads 116 but may appear to come into close proximity to one another. Said for clarity, in the arrangement shown, the contact pads 116 are directly connected to the switch 124 and/or switches 124. The contact pads 116 are connected directly to the switches 124, in the arrangement shown, via traces 122 located within the printed circuit board 110. However, the traces 122 need not be located within the interior of the printed circuit board 110. Alternatively, traces 122 may be located on the exterior of the printed circuit board 110.

In the arrangement shown, circuit board assembly includes a plurality of switches 124. Switches 124 are formed of any suitable size, shape, and design and is configured to perform a plurality of various switching functions depending on the type of switch employed. Some examples of switches are control switches, programming switches, and the like. The arrangement shown, includes a programming dip switch 120. Programming dip switch 120 may be formed of any suitable size, shape, and design and is configured to customize the behavior of system 10. In the arrangement shown, other examples of switches include electrical power switching elements 124, other switches, as well as a control signal connector 118 and other connectors such as a ground connector 118.

In the arrangement shown, as one example, printed circuit board 110 includes a microprocessing unit 126. Microprocessing unit 126 may be formed and configured in any suitable size, shape, and design and for any suitable function depending on the inputs required and the desired goals for the applications of system 10. In the arrangement as is shown, microprocessing unit 126 is configured to facilitate processing of information (including data sets) in association with a computing device, memory, software and possibly an interactive user display. Microprocessor 126 may be a single component, such as a microprocessor chip, or alternatively microprocessor 126 may be formed of a plurality of processing components that are connected to one another that may be co-located or located at different geographic locations. Microprocessor 126 sends and receives information and instructions from and as well as to database, server or cloud, memory, software and potentially an interactive user display. In one arrangement, microprocessor 126 receives information stored in a memory and processes this information pursuant to instructions or software interpreted with inputs received from a plurality of sensors.

In Operation/Methods of Use:

System Embodiments: As one example, and in the arrangement shown, in figure #, a system embodiment 200 includes a power supply 202, a start system 204, at least one load 206, at least one functional element 208, and a microprocessing unit 126.

Figure 9:
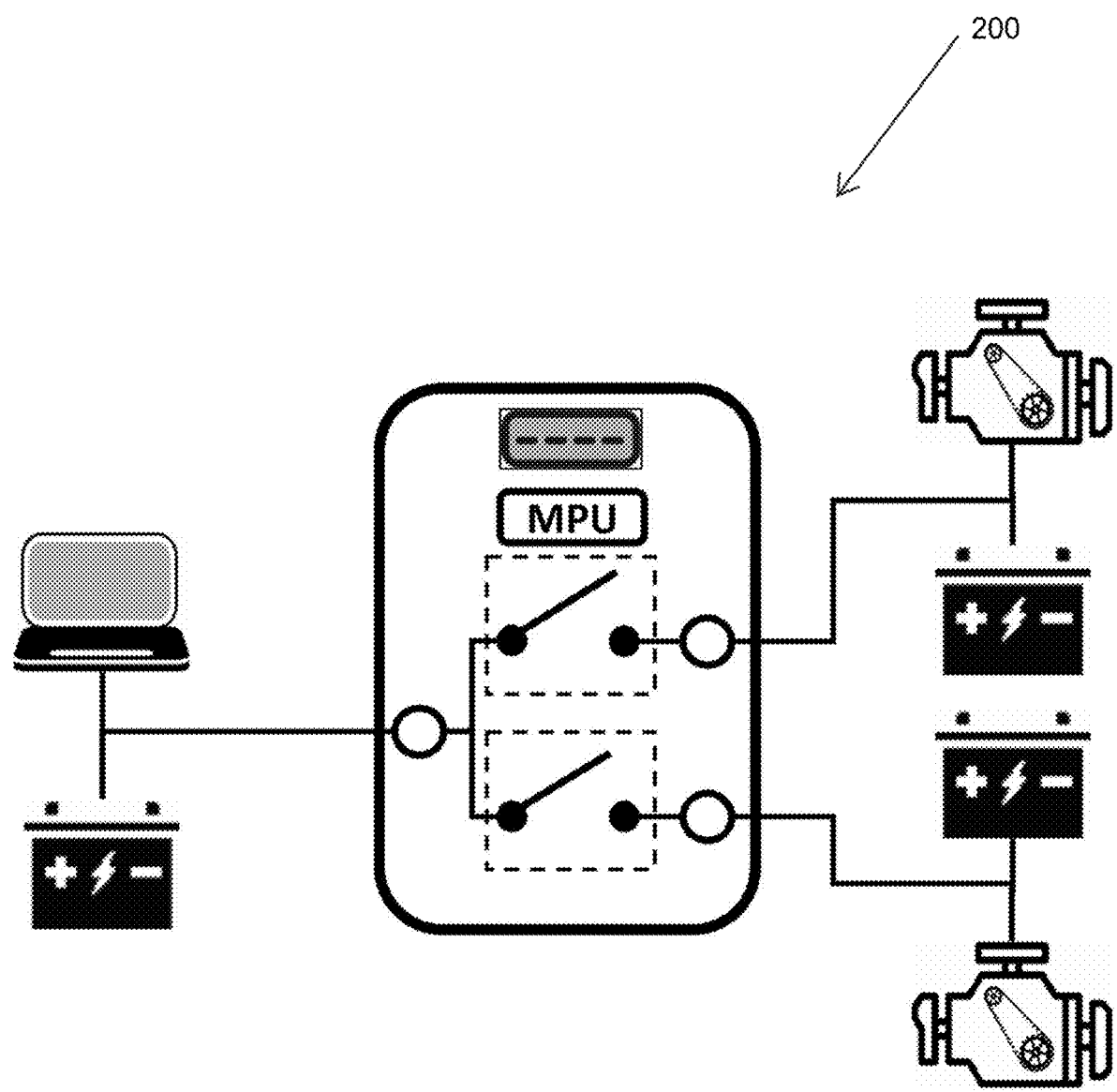
FIG. 9 is a diagram illustrating an embodiment deploying the disclosure; the view showing at least one power supply; the view showing a start system; the view showing at least one load; the view showing at least one functional element; the view showing a microprocessing unit.

As another example, and in the arrangement shown in FIG. 9, this system embodiment shows an auxiliary battery being utilized as a power supply 202. Additionally, a start battery system 204 is shown. Furthermore, electrical loads 206 are shown connected to the system 10. In this arrangement, as is shown, a function element 208 is configured such that a user can control an on/off switch. Furthermore, in this example, the switch can be configured to automatically and autonomously switch on and switch off.

On and off switching in this example is dependent on the state of the charge of the battery. This automatic on/off switching is achieved by adding functionality to the microprocessing unit 126.

Figure 10:
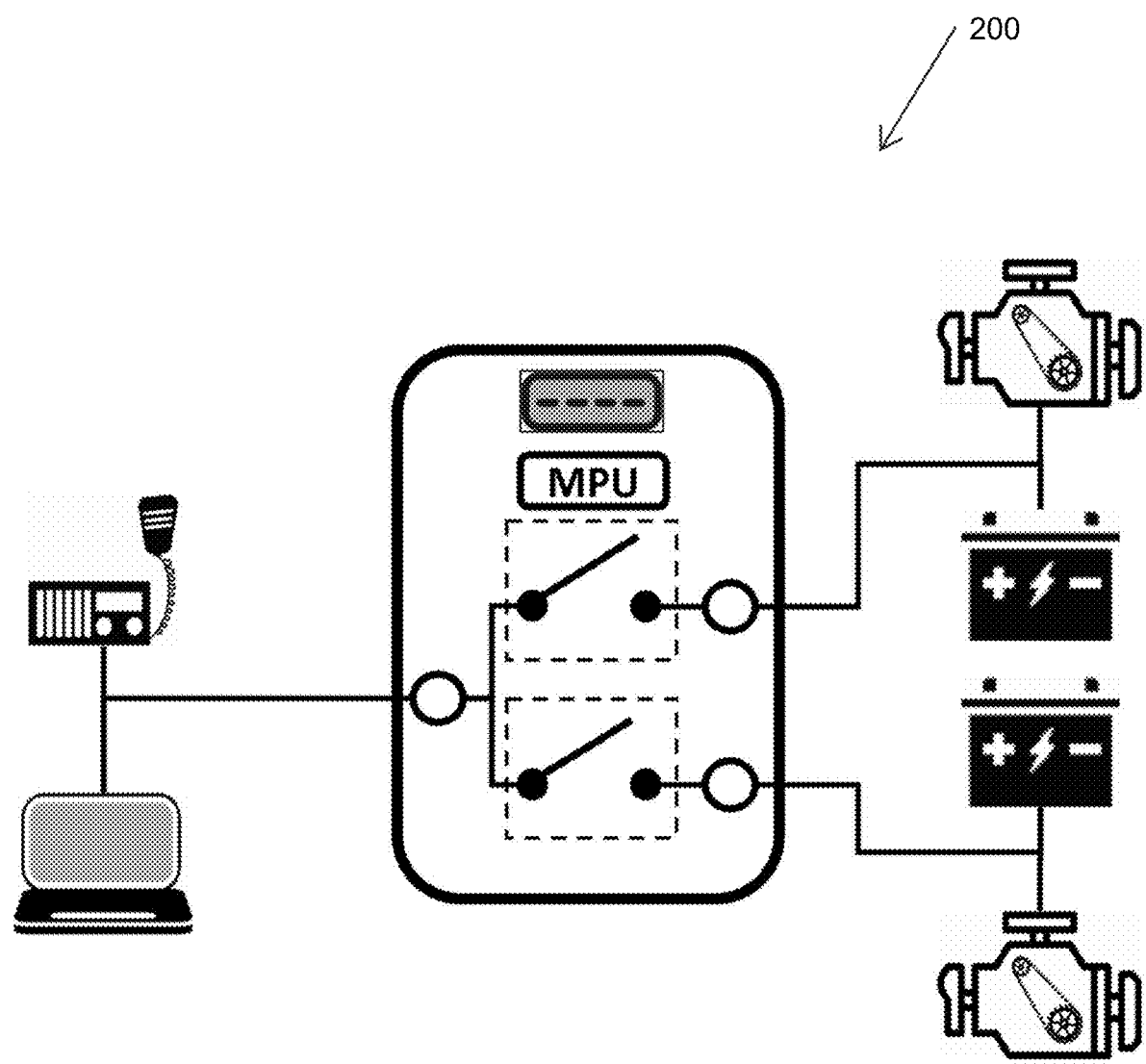
FIG. 10 is a diagram illustrating an embodiment deploying the disclosure; the view showing at least one power supply; the view showing a start system; the view showing at least one load; the view showing at least one functional element; the view showing a microprocessing unit.

As another example, and in the arrangement shown in FIG. 10, this system embodiment shows an auxiliary battery being utilized as a power supply 202. Additionally, a start battery system 204 is shown. Furthermore, electrical loads 206 are shown connected to the system 10. In this arrangement, as is shown, a function element 208 is configured such that a user can control an on/off switch. Furthermore, in this example, the switch can be configured to automatically and autonomously switch on and switch off.

On and off switching in this example is dependent on the state of the charge of the battery. This automatic on/off switching is achieved by adding functionality to the microprocessing unit 126. Furthermore, this arrangement also includes a second battery to depict a second power supply 202 and how a plurality of power supplies 202 can be connected to system 10.

Figure 11:
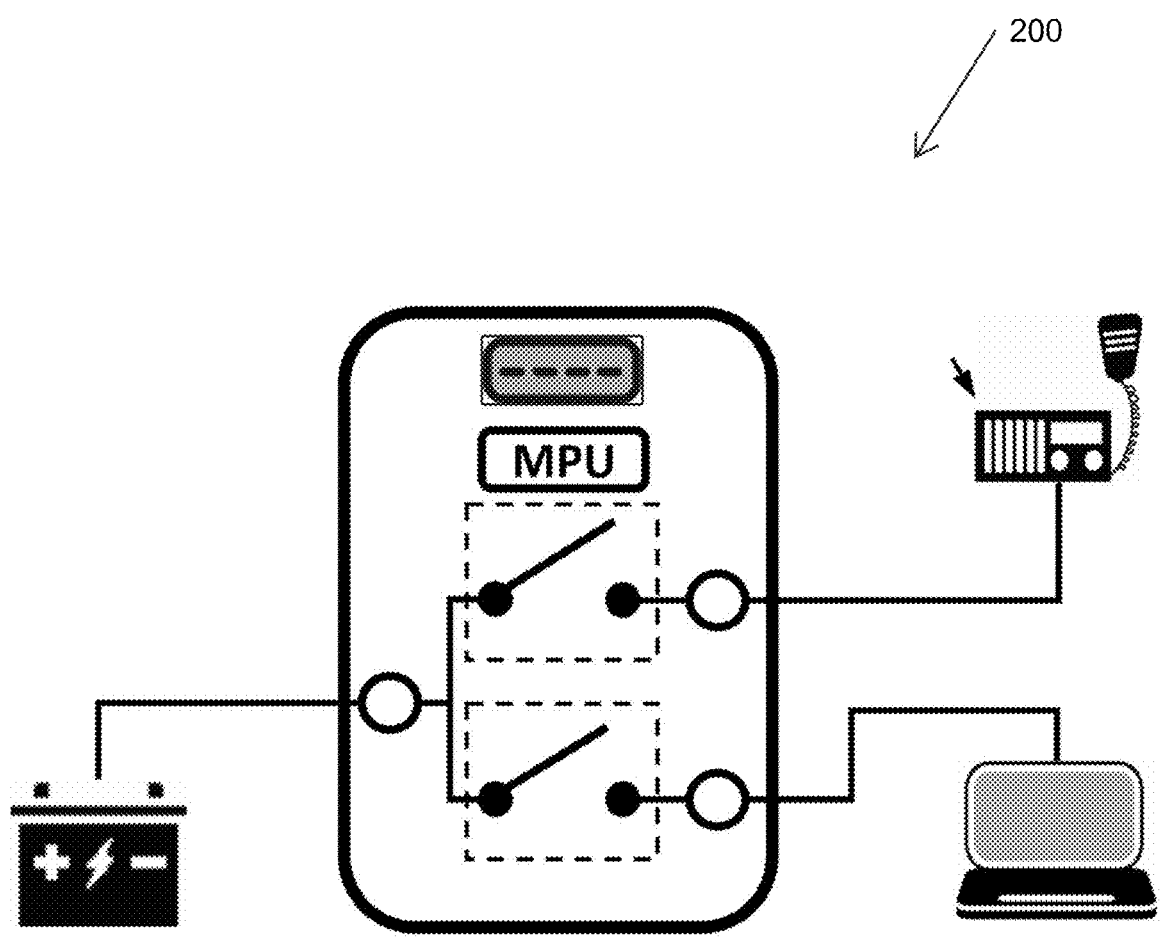
FIG. 11 is a diagram illustrating an embodiment deploying the disclosure; the view showing at least one power supply; the view showing a start system; the view showing at least one load; the view showing at least one functional element; the view showing a microprocessing unit.

As another example, and in the arrangement shown in FIG. 11, this system embodiment shows an auxiliary battery being utilized as a power supply 202. Additionally, a start battery system 204 is shown. Furthermore, electrical loads 206 are shown connected to the system 10. In this arrangement, as is shown, a function element 208 is configured such that a user can control an on/off switch. Furthermore, in this example, the switch can be configured to automatically and autonomously switch on and switch off.

On and off switching in this example is dependent on the state of the charge of the battery. This automatic on/off switching is achieved by adding functionality to the microprocessing unit 126. Furthermore, this arrangement also includes a second battery to depict a second power supply 202 and how a plurality of power supplies 202 can be connected to system 10. Additionally, in this arrangement, as shown in FIG. 11, a load can be connected in an arrangement known as source seeking. In this way, the load can connect to power from the power source which has the best supply.

Said another way, FIG. 11 depicts an embodiment 200 with an auxiliary battery, a first set of electrical loads, and a second set of electrical loads wherein the first set and the second set are interconnected. Functional element would operates as a user controllable battery disconnect device or it can be automatically turned on and off depending on the state of charge for the auxiliary battery. Functional element would operate as a user controllable battery disconnect device or it can be automatically turned on and off depending on the state of charge for the auxiliary battery. Automatic functionality if desired is achieved through a microprocessor control unit 126 located on the printed circuit board assembly 116 within the embodiment 200. The general term for the functionality this device creates is called "Load Shedding Relay" or "Dual LVD Relay".

Figure 12:
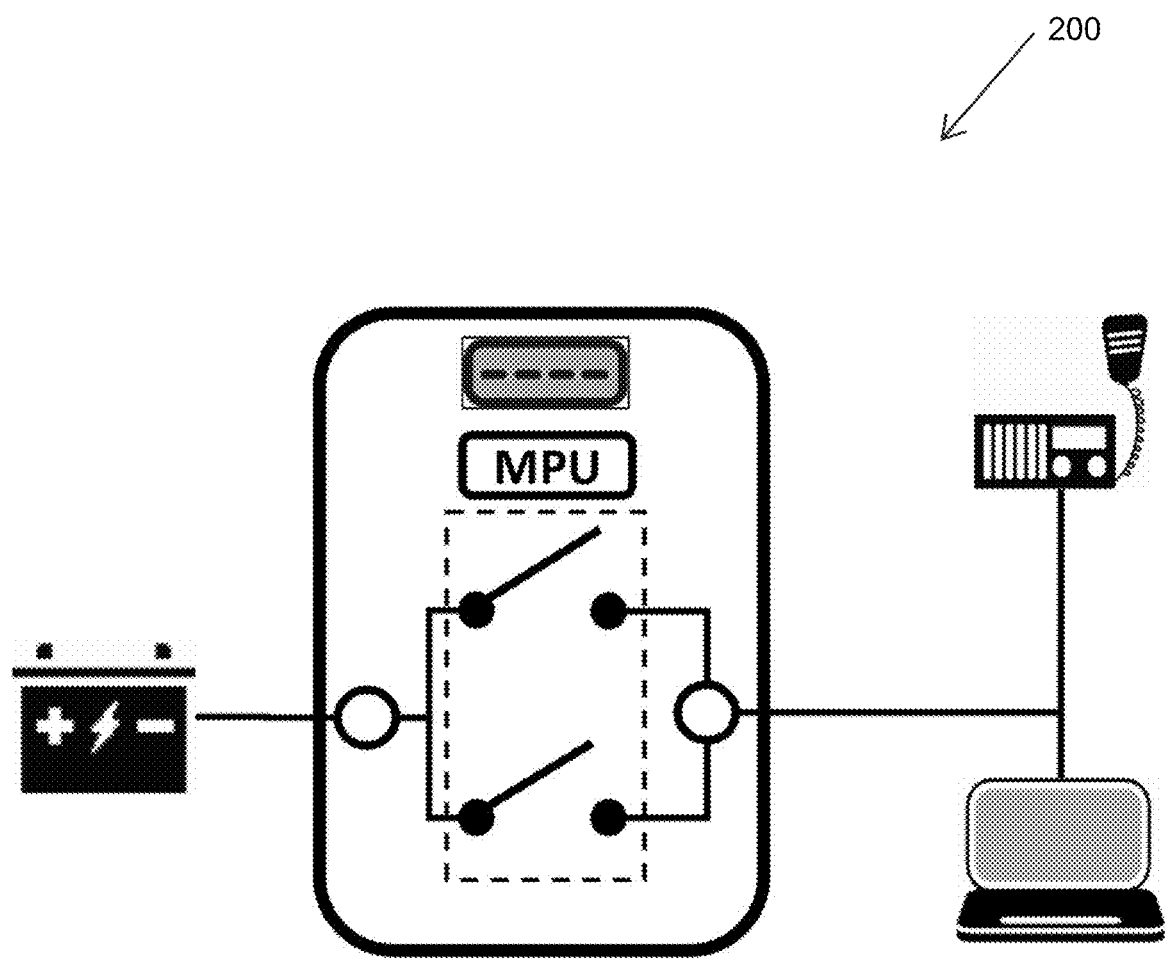
FIG. 12 is a diagram illustrating an embodiment deploying the disclosure; the view showing at least one power supply; the view showing a start system; the view showing at least one load; the view showing at least one functional element; the view showing a microprocessing unit.

As another example, and in the arrangement shown in FIG. 12, this system embodiment shows an auxiliary battery being utilized as a power supply 202. Additionally, a start battery system 204 is shown. Furthermore, electrical loads 206 are shown connected to the system 10. In this arrangement, as is shown, a function element 208 is configured such that a user can control an on/off switch. Furthermore, in this example, the switch can be configured to automatically and autonomously switch on and switch off.

On and off switching in this example is dependent on the state of the charge of the battery. This automatic on/off switching is achieved by adding functionality to the microprocessing unit 126. Furthermore, this arrangement also includes a second battery to depict a second power supply 202 and how a plurality of power supplies 202 can be connected to system 10. Additionally, in this arrangement, as shown in FIG. 12, a first set of electrical loads are included in this arrangement as well as a second set of electrical loads and can be connected in an arrangement known as dual lvd relay.

Said another way, FIG. 12 depicts a start or auxiliary battery and a set of electrical loads wherein the set of electrical loads and power supply are interconnected with system 10. Functional element operates as a user controllable load disconnect device or it can be automatically turned on and off depending on the state of charge for the start or auxiliary battery. Automatic functionality if desired is achieved through a microprocessor control unit 126 located on the printed circuit board assembly 116 within the embodiment. The general term for the functionality this device creates is called "Low Voltage Disconnect (LVD) Relay" or "Battery Switch".

Figure 13:
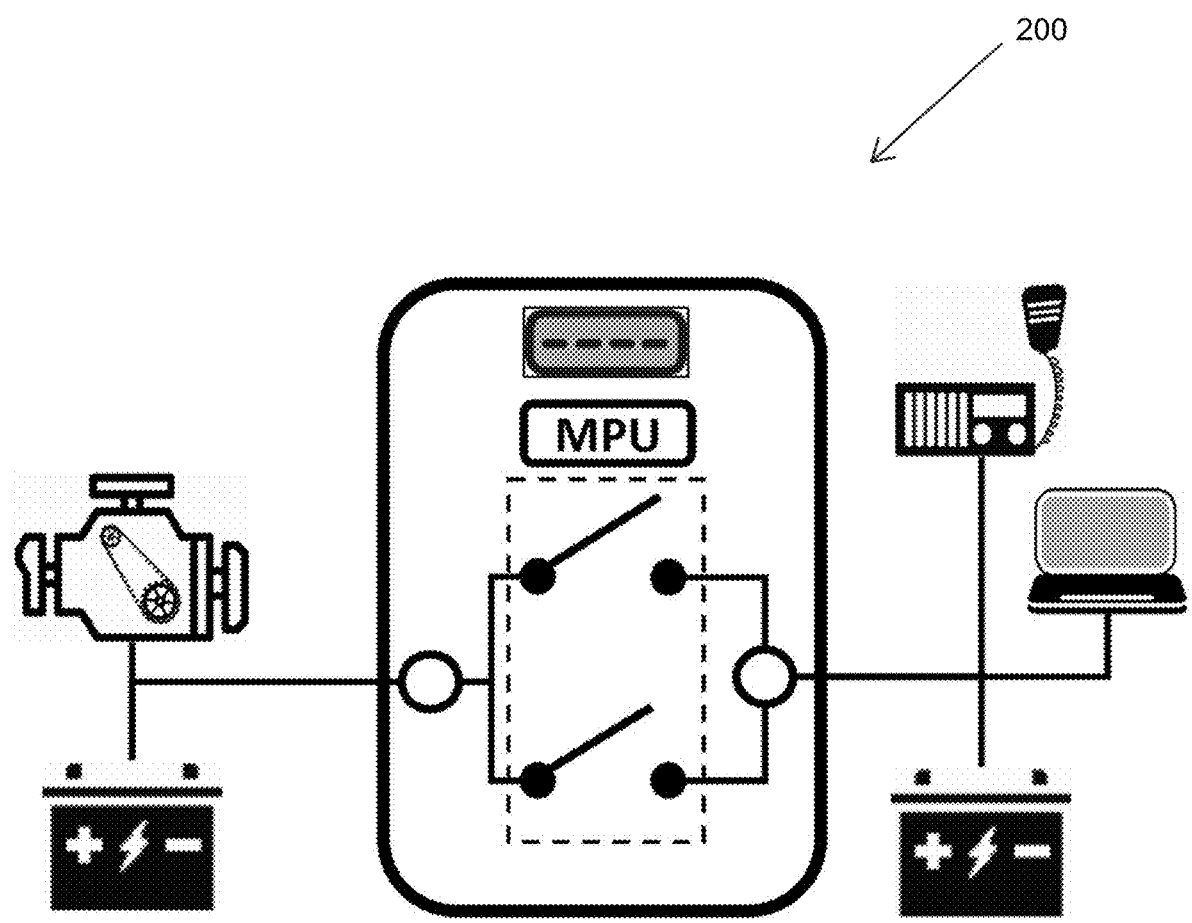
FIG. 13 is a diagram illustrating an embodiment deploying the disclosure; the view showing at least one power supply; the view showing a start system; the view showing at least one load; the view showing at least one functional element; the view showing a microprocessing unit.

As another example, and in the arrangement shown in FIG. 13, system embodiment 200 depicts a start battery and an auxiliary battery with electrical loads wherein they are interconnected with system 10. Functional element operates as a user controllable battery interconnection device or it can be automatically turned on and off depending on the state of charge for the start or auxiliary battery or the start battery. Automatic functionality if desired is achieved through a microprocessor control unit 126 located on the printed circuit board assembly 116 within the embodiment. The general term for the functionality this device creates is called "Automatic Charging Relay" or "Battery Parallel Switch" or "Voltage Sensitive Relay".

It will be appreciated by those skilled in the art that other various modifications could be made to the device without parting from the spirit and scope of this disclosure. All such modifications and changes fall within the scope of the claims and are intended to be covered thereby.

What is claimed:

1. An electrical switching device comprising: a housing; one or more control input terminals; the control input terminals including an electrical ground reference voltage; wherein the control input terminals receive transmissions from a plurality of sources; three or more terminal studs; the terminal studs electrically connected within the housing to two or more internal electrical switching elements; the electrical switching elements being independently controllable, a circuit board assembly; the circuit board; the circuit board assembly having a microprocessing unit receives inputs and determines outputs and modifies a state of electrical switching elements; wherein the microprocessing unit has an algorithm stored on a memory which determines outputs based on a plurality of inputs received, wherein the terminal stud extending a length from a first end to a second end; a terminal receiving opening; wherein the terminal stud extends through the terminal receiving opening; and a terminal nut; wherein the terminal nut secures a cable to the terminal bolt.

2. The device of claim 1, further comprising:
programming dip switches on the circuit board assembly.
3. The device of claim 1, further comprising:
a dip switch cover.
4. The device of claim 3, further comprising:
the dip switch cover having a connecting feature; wherein the connecting feature attaches the dip switch cover to the housing.
5. The device of claim 1, further comprising:
at least one sensor; wherein the sensor detects at least one condition in the system.
6. The device of claim 1, further comprising:
at least one sensor; wherein the sensor detects at least one condition in the environment.
7. The device of claim 1, further comprising:
at least one terminal stud guard.
8. The device of claim 1, further comprising:
at least one contact pad.
9. The device of claim 1, further comprising:
the circuit board assembly having a plurality of terminal receiving openings; and
wherein the terminal receiving openings are configured to receive a terminal bolt therein.
10. The system of claim 1, further comprising:
the circuit board assembly having a plurality of contact pads; wherein the contact pads receive a conductive source; wherein the contact pads are connected to a plurality of traces;
wherein the traces are connected to switches; and
wherein the switches can be manually or autonomously switched, thereby changing a path of conductance.

11. The system of claim 10, further comprising:
the circuit board assembly having a plurality of terminal receiving openings;
wherein the terminal receiving openings are configured to receive a terminal bolt therein; the circuit board assembly having a plurality of contact pads;
wherein the contact pads receive one or more conductive sources; wherein the contact pads are connected to a plurality of traces;
wherein the traces are connected to switches; and
wherein the switches can be manually or autonomously switched, thereby changing a path of conductance; the contact pads configured to be connected individually to a single conductive source or for two or more contact pads to be connected together to a single conductive source by surrounding two or more contact pads in close proximity to the terminal receiving openings.

12. A flexible intelligent autonomous switching device comprising:
a housing;
the housing extending from a top to a bottom and having a peripheral edge; the housing having a hollow interior;
a program cover;
the program cover having a top and a bottom; the program cover having a connecting feature; wherein the connecting feature attaches the program cover to the housing;
a power terminal;
the power terminal having a terminal housing; wherein the terminal housing receives a transmission from a source;
a bottom cover;
the bottom cover having a generally flat shape and a peripheral edge; the bottom cover having a plurality of attachment features; wherein the bottom cover encloses the hollow interior of the housing;
wherein a path of conductance is autonomously directed through the functional element by a plurality of switches controlled by a microprocessing unit with a predetermined dataset of rules.

13. A method for autonomously controlling multiple independent electrical switches in an intelligent way, the steps comprising:
providing a flexible intelligent autonomous switching device; the switching device comprising a housing, one or more control input terminals, three or more terminal studs, two or more electrical switching elements, and a circuit board assembly; the circuit board assembly having a printed circuit board having a plurality of traces;
providing a first power supply; providing a second power supply; providing a start system; providing a first load; providing a second load; providing a functional element; interconnecting the first power supply with the functional element; interconnecting the first load with the functional element; transmitting electrical conductance from the first power supply, second power supply, start system, first load, or second load to functional elements through cables to the power terminals; transmitting electrical conductance from the power terminals to the functional elements through electrical conductors; controlling the path of conductance autonomously by a microprocessing unit with a predetermined dataset of rules.

14. The method of claim 13, further comprising the steps: wherein the functional elements include two user controllable on/off switches; wherein the functional elements can be automatically and independently turned on/off by signals from the microprocessing unit when the microprocessing unit receives a signal from a sensor indicating to the microprocessing unit the status of the first power supply, the second power supply, and start system; thereby creating a triple battery parallel switch.

15. The method of claim 13, further comprising the steps: wherein the functional elements include three user controllable on/off switches; wherein the functional elements can be automatically and independently turned on/off by signals from the microprocessing unit when the microprocessing unit receives a signal from a sensor indicating to the microprocessing unit the status of the first power supply, the second power supply, a third power supply, and start system; thereby creating a quadruple battery parallel switch.

16. The method of claim 13, further comprising the steps: wherein the functional elements include two user controllable on/off switches; wherein the functional elements can be automatically and independently turned on/off by signals from the microprocessing unit when the microprocessing unit receives a signal from a sensor indicating to the microprocessing unit the status of the start system, second power supply, and first load; thereby creating a dual battery parallel switch integrated with an accessory load control switch.

17. The method of claim 13, further comprising the steps: wherein the functional elements include three user controllable on/off switches; wherein the functional elements can be automatically and independently turned on/off by signals from the microprocessing unit when the microprocessing unit receives a signal from a sensor indicating to the microprocessing unit the status of the start system, a first power supply, a second power supply, and first load; thereby creating a thriple battery parallel switch integrated with an accessory load control switch.

18. The method of claim 13, further comprising the steps: wherein the functional elements include two or more user controllable on/off switches; wherein the functional elements can be automatically and independently turned on/off by signals from the microprocessing unit when the microprocessing unit receives a signal from a sensor indicating to the microprocessing unit the status of a minimum of first and second power supplies, and first load; thereby creating a source selection switch.

19. The method of claim 13, further comprising the steps: wherein the functional elements include two or more user controllable on/off switches; wherein the functional elements can be automatically and independently turned on/off by signals from the microprocessing unit when the microprocessing unit receives a signal from a sensor indicating to the microprocessing unit the status of the first power supply, a minimum of first and second loads; thereby creating a load shedding switch.

* * * * *